US012593581B2

(12) United States Patent
 Gu et al.

(10) Patent No.: US 12,593,581 B2
(45) Date of Patent: Mar. 31, 2026

(54) DISPLAY PANEL AND DISPLAY DEVICE INCLUDING THE SAME

(71) Applicant: Samsung Display Co., Ltd., Yongin-si (KR)

(72) Inventors: Bon-Seog Gu, Yongin-si (KR);
 Hae-Kwan Seo, Yongin-si (KR);
 Jinyoung Roh, Yongin-si (KR);
 Jaekeun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 390 days.

(21) Appl. No.: 18/468,376

(22) Filed: Sep. 15, 2023

(65) Prior Publication Data

US 2024/0179980 A1 May 30, 2024

(30) Foreign Application Priority Data

Nov. 28, 2022 (KR) ......................... 10-2022-0161081

(51) Int. Cl.
 *H10K 59/131* (2023.01)
 *H10K 59/121* (2023.01)
 *H10K 59/35* (2023.01)
 *H10K 59/80* (2023.01)
 *H10K 59/88* (2023.01)

(52) U.S. Cl.
 CPC ......... *H10K 59/131* (2023.02); *H10K 59/121* (2023.02); *H10K 59/353* (2023.02); *H10K 59/8051* (2023.02); *H10K 59/88* (2023.02)

(58) Field of Classification Search
 CPC .... H10K 59/131; H10K 59/353; H10K 59/88;
 H10K 59/8051; H10K 59/121
 See application file for complete search history.

(56) References Cited

U.S. PATENT DOCUMENTS

| | | | |
|---|---|---|---|
| 8,138,996 B2 * | 3/2012 | Nakanishi | ............ H10K 59/121 |
| | | | 313/500 |
| 10,210,804 B2 | 2/2019 | Kim et al. | |
| 2019/0114459 A1 * | 4/2019 | Ma | ..................... G06V 40/1318 |
| 2021/0210474 A1 * | 7/2021 | Ikeda | ......................... G09F 9/33 |

FOREIGN PATENT DOCUMENTS

KR 10-2018-0072303 A 6/2018

* cited by examiner

*Primary Examiner* — Peniel M Gumedzoe
(74) *Attorney, Agent, or Firm* — Womble Bond Dickinson (US) LLP

(57) ABSTRACT

A display panel includes pixel circuits at a first row and a second row, and light-emitting elements at the first row and the second row, wherein the light-emitting elements at the first row include an anode and a dummy connection electrode extending from the anode, and are respectively electrically connected with, and overlap, the pixel circuits at the first row, and wherein a first light-emitting element among the light-emitting elements at the second row is spaced from a first pixel circuit among the pixel circuits at the second row, and is electrically connected with the first pixel circuit through a connection electrode and a first connection node.

20 Claims, 11 Drawing Sheets

FIG. 7B

DISPLAY PANEL AND DISPLAY DEVICE INCLUDING THE SAME

CROSS-REFERENCE TO RELATED APPLICATIONS

This application claims priority to, and the benefit of, Korean Patent Application No. 10-2022-0161081 filed on Nov. 28, 2022, in the Korean Intellectual Property Office, the disclosure of which are incorporated by reference herein in their entireties.

BACKGROUND

1. Field

Embodiments of the present disclosure described herein relate to a display device.

2. Description of the Related Art

In general, a display device includes a display panel for displaying an image and a driving circuit driving the display panel. The display panel includes a plurality of scan lines, a plurality of data lines, and a plurality of pixels. The driving circuit includes a data-driving circuit that outputs data-driving signals to the data lines, a scan-driving circuit that outputs scan signals for driving the scan lines, and a driving controller that controls the data-driving circuit and the scan-driving circuit.

The display device may display an image by outputting a scan signal to a scan line connected with a pixel targeted for display, and by providing a data voltage corresponding to a display image to a data line connected with the pixel.

Also, each of the plurality of pixels may provide one of various color lights, such as a red light, a green light, and a blue light. Each of the plurality of pixels may include a light-emitting element and a pixel circuit for driving the light-emitting element. Sizes of the plurality of pixels and ways to arrange the plurality of pixels may be variously determined.

SUMMARY

Embodiments of the present disclosure provide a display panel capable of reducing power consumption, and a display device including the same.

According to one or more embodiments, a display panel includes pixel circuits at a first row and a second row, and light-emitting elements at the first row and the second row, wherein each of the light-emitting elements at the first row comprise an anode, and is electrically connected with, and overlap, corresponding one of the pixel circuits at the first row, wherein the anode of each of the light-emitting elements at the first row comprises a dummy connection electrode extending from the anode, and wherein a first light-emitting element among the light-emitting elements at the second row is spaced from a first pixel circuit among the pixel circuits at the second row, and is electrically connected with the first pixel circuit through a connection electrode and a first connection node.

A second light-emitting element among the light-emitting elements at the second row may be electrically connected with a second pixel circuit among the pixel circuits at the second row through a second connection node.

The first light-emitting element may be spaced from the first pixel circuit in a first direction.

The first light-emitting element may include an anode, wherein the connection electrode extends from the anode of the first light-emitting element in the first direction.

The dummy connection electrode may extend from the anode of each of the light-emitting elements at the first row in a direction that is opposite to the first direction.

The dummy connection electrode may include a first branch part and a second branch part, wherein the first branch part extends from the anode in a direction that is opposite to the first direction, and wherein the second branch part extends from, and forms an angle with, the first branch part.

The pixel circuits may be respectively connected with a corresponding data line among first to fourth data lines.

The light-emitting elements may include the first light-emitting element for emitting light corresponding to a first color, a second light-emitting element for emitting light corresponding to a second color, and a third light-emitting element for emitting light corresponding to a third color.

The first data line may be configured to transfer a data signal corresponding to the first color, wherein the third data line is configured to transfer a data signal corresponding to the second color, wherein the second data line is configured to transfer a data signal corresponding to the third color, and wherein the fourth data line is configured to transfer a data signal corresponding to the third color.

The first pixel circuit may be connected with the first data line, wherein the second light-emitting element at the second row is electrically connected with a second pixel circuit connected with the third data line from among the pixel circuits at the second row.

According to one or more embodiments, a display panel includes first to fourth data lines, pixel circuits respectively at crossing regions of first to fourth columns and first and second rows, and respectively connected with the data lines, and light-emitting elements, wherein the light-emitting elements at the first row are respectively electrically connected with the pixel circuits at the first row, wherein a first light-emitting element of the light-emitting elements at the second row and at the first column is electrically connected with a corresponding pixel circuit of the pixel circuits at the second row and at the third column through an anode, a connection electrode extending from the anode in a first direction, and a connection node, and wherein a second light-emitting element of the light-emitting elements at the first row and the first column includes an anode, and a dummy connection electrode parallel to the connection electrode and extending from the anode.

A third light-emitting element of the light-emitting elements at a crossing region of the second row and the second column may be electrically connected with a corresponding pixel circuit among pixel circuits at the second row, wherein a fourth light-emitting element of the light-emitting elements at crossing region of the second row and the fourth column is electrically connected with another corresponding pixel circuit among pixel circuits at the second row.

The light-emitting elements respectively at crossing regions of the first row and the first to fourth columns may be respectively electrically connected with the pixel circuits respectively at the crossing regions of the first row and the first to fourth columns.

The dummy connection electrode may include a first branch part extending from the anode, and a second branch part extending from the first branch part at an angle.

The first branch part may be parallel to the connection electrode.

According to one or more embodiments, a display comprising insulating layers, light-emitting elements and first to fourth pixel circuits connected with first to fourth data lines, respectively, wherein each of the light-emitting elements includes an anode and a cathode, wherein the insulating layers include a first insulating layer on the first to fourth pixel circuits, and a second insulating layer on the first insulating layer, wherein the first to fourth data lines are between the first insulating layer and the second insulating layer, wherein the anode of each of the light-emitting elements is on the second insulating layer, wherein the anode of a first light-emitting element from among the light-emitting elements at a first row comprises a dummy connection electrode extending from the anode of the first light-emitting element, wherein the anode of a second light-emitting element from among the light-emitting elements at a second row comprises a connection electrode extending from the anode, wherein the anode of the first light-emitting element at the first row is connected with the first pixel circuit through a first connection node penetrating the second insulating layer and through a first contact hole penetrating the first insulating layer, and wherein the connection electrode of the first light-emitting element at the second row is connected with the third pixel circuit through a second connection node penetrating the second insulating layer, and through a second contact hole penetrating the first insulating layer.

The connection electrode of the first light-emitting element at the second row may extend from the anode in a first direction, wherein the dummy connection electrode of the first light-emitting element at the first row is parallel to the connection electrode at the second row.

The dummy connection electrode may include a first branch part and a second branch part, wherein the first branch part is parallel to the connection electrode at the second row, wherein the second branch part extends from the first branch part at an angle.

The dummy connection electrode of the first light-emitting element at the first row may overlap the second pixel circuit at the first row, wherein the connection electrode of the first light-emitting element at the second row overlaps the third pixel circuit at the second row.

The first and second data lines may overlap the anode of the first light-emitting element at the first row, wherein the third and fourth data lines overlap the anode of the second light-emitting element at the second row.

BRIEF DESCRIPTION OF THE DRAWINGS

The above and other aspects of the present disclosure will become apparent by describing in detail embodiments thereof with reference to the accompanying drawings.

FIGS. 7A and 7B are cross-sectional views illustrating a portion of a first light-emitting element and a pixel circuit of a display panel according to one or more embodiments of the present disclosure.

DETAILED DESCRIPTION

Figure 1:
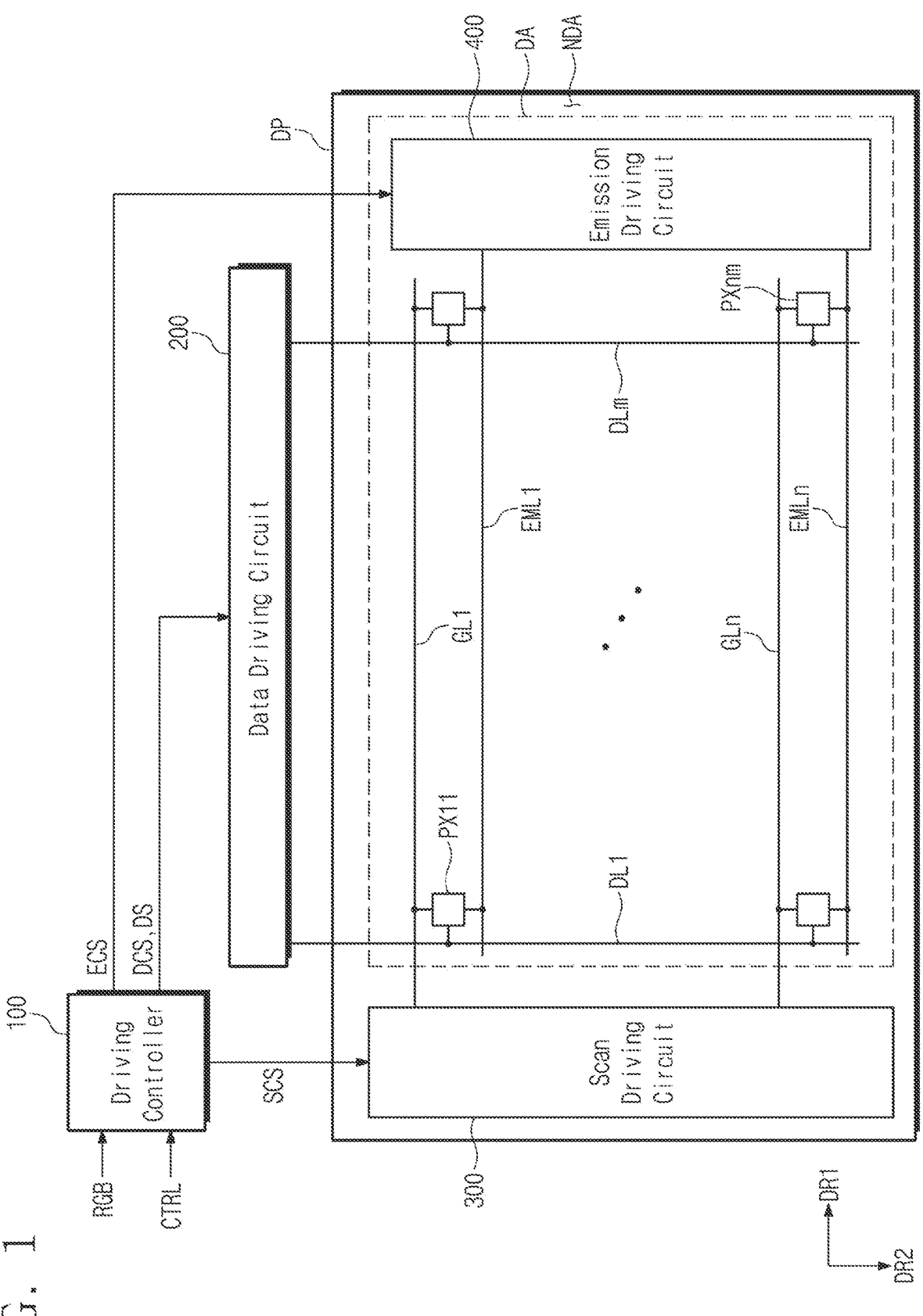
FIG. 1 is a block diagram of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Some embodiments are described in the accompanying drawings in relation to functional block, unit, and/or module. Those skilled in the art will understand that such block, unit, and/or module are/is physically implemented by a logic circuit, an individual component, a microprocessor, a hard electrode circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of a display device according to one or more embodiments of the present disclosure.

Referring to FIG. 1, a display device DD includes a driving controller 100, a data-driving circuit 200, and a display panel DP.

The driving controller 100 receives an input image signal RGB and a control signal CTRL. The driving controller 100 generates an output image signal DS obtained by converting the input image signal RGB so as to have an image type appropriate for the display panel DP. The driving controller 100 outputs a scan control signal SCS and a data control signal DCS.

The display panel DP according to one or more embodiments of the present disclosure may be a light-emitting display panel. For example, the display panel DP may be an organic light-emitting display panel, an inorganic light-emitting display panel, or a quantum dot light-emitting display panel. An emission layer of the organic light-emitting display layer may include an organic light-emitting material. An emission layer of the inorganic light-emitting display panel may include an inorganic light-emitting material. An emission layer of the quantum dot light-emitting display panel may include a quantum dot, a quantum rod, etc. In one or more embodiments, below, the description will be given under the condition that the display panel DP is an organic light-emitting display panel.

The display panel DP may include scan lines GL1 to GLn, data lines DL1 to DLm, and pixels PX11 to PXnm.

The display panel DP may include a display area DA and a non-display area NDA. In one or more embodiments, the display area DA has a rectangular shape, but the present disclosure is not limited thereto. The non-display area NDA may be in the shape of a frame surrounding the display area DA (e.g., in plan view).

The display panel DP may further include a scan-driving circuit 300 and an emission-driving circuit 400. The pixels PX11 to PXnm may be located in the display area DA, and the scan-driving circuit 300 and the emission-driving circuit 400 may be located in the non-display area NDA.

The scan lines GL1 to GLn extend from the scan-driving circuit 300 in a first direction DR1, and are arranged to be spaced from each other in a second direction DR2. Emission control lines EML1 to EMLn extend from the emission-driving circuit 400 in a direction facing away from the first direction DR1, and are arranged to be spaced from each other in the second direction DR2. The data lines DL1 to DLm extend from the data-driving circuit 200 in the second direction DR2, and are arranged to be spaced from each other in the first direction DR1.

Each of the pixels PX11 to PXnm may be connected with a corresponding scan line among the scan lines GL1 to GLn, may be connected with a corresponding data line among the data lines DL1 to DLm, and may be connected with a corresponding emission control line among the emission control lines EML1 to EMLn. An example in which each of the plurality of pixels PX11 to PXnm is connected with one scan line is illustrated in FIG. 1, but the present disclosure is not limited thereto. For example, each of the plurality of the pixels PX11 to PXnm may be electrically connected with two or more scan lines.

Each of the pixels PX11 to PXnm may include a light-emitting element, and a pixel circuit for controlling the emission of the light-emitting element. The light-emitting element and the pixel circuit will be described in detail later.

The data-driving circuit 200 receives the data control signal DCS and the output image signal DS from the driving controller 100. The data-driving circuit 200 converts the output image signal DS into data signals, and then outputs the data signals to the data lines DL1 to DLm. Each of the data signals may have a voltage level corresponding to a grayscale level of the output image signal DS.

The data-driving circuit 200 may be implemented as an integrated circuit (IC), and may be directly mounted in an area (e.g., a predetermined area) of the display panel DP. Alternatively, the data-driving circuit 200 may be mounted on a separate printed circuit board in a chip on film (COF) scheme so as to be electrically connected with the display panel DP. In one or more embodiments, the data-driving circuit 200 may be formed in a same process as the pixel circuit of each of the pixels PX11 to PXnm on the display panel DP.

The scan-driving circuit 300 receives the scan control signal SCS from the driving controller 100. The scan-driving circuit 300 may output scan signals to the scan lines GL1 to GLn in response to the scan control signal SCS. In one or more embodiments, the scan-driving circuit 300 may be formed in the same process as the pixel circuit of each of the pixels PX11 to PXnm.

The emission-driving circuit 400 receives an emission-driving signal ECS from the driving controller 100. The emission-driving circuit 400 may output emission control signals to the emission control lines EML1 to EMLn in response to the emission-driving signal ECS. In one or more embodiments, the emission-driving circuit 400 may be formed in a same process as the pixel circuit of each of the pixels PX11 to PXnm. The emission-driving circuit 400 is illustrated in FIG. 1, but the present disclosure is not limited thereto. In one or more embodiments, the emission-driving circuit 400 may be included in the scan-driving circuit 300.

The driving controller 100, the data-driving circuit 200, the scan-driving circuit 300, and the emission-driving circuit 400 may constitute a driving circuit for providing data signals corresponding to the input image signal RGB to the pixels PX11 to PXnm.

Figure 2:
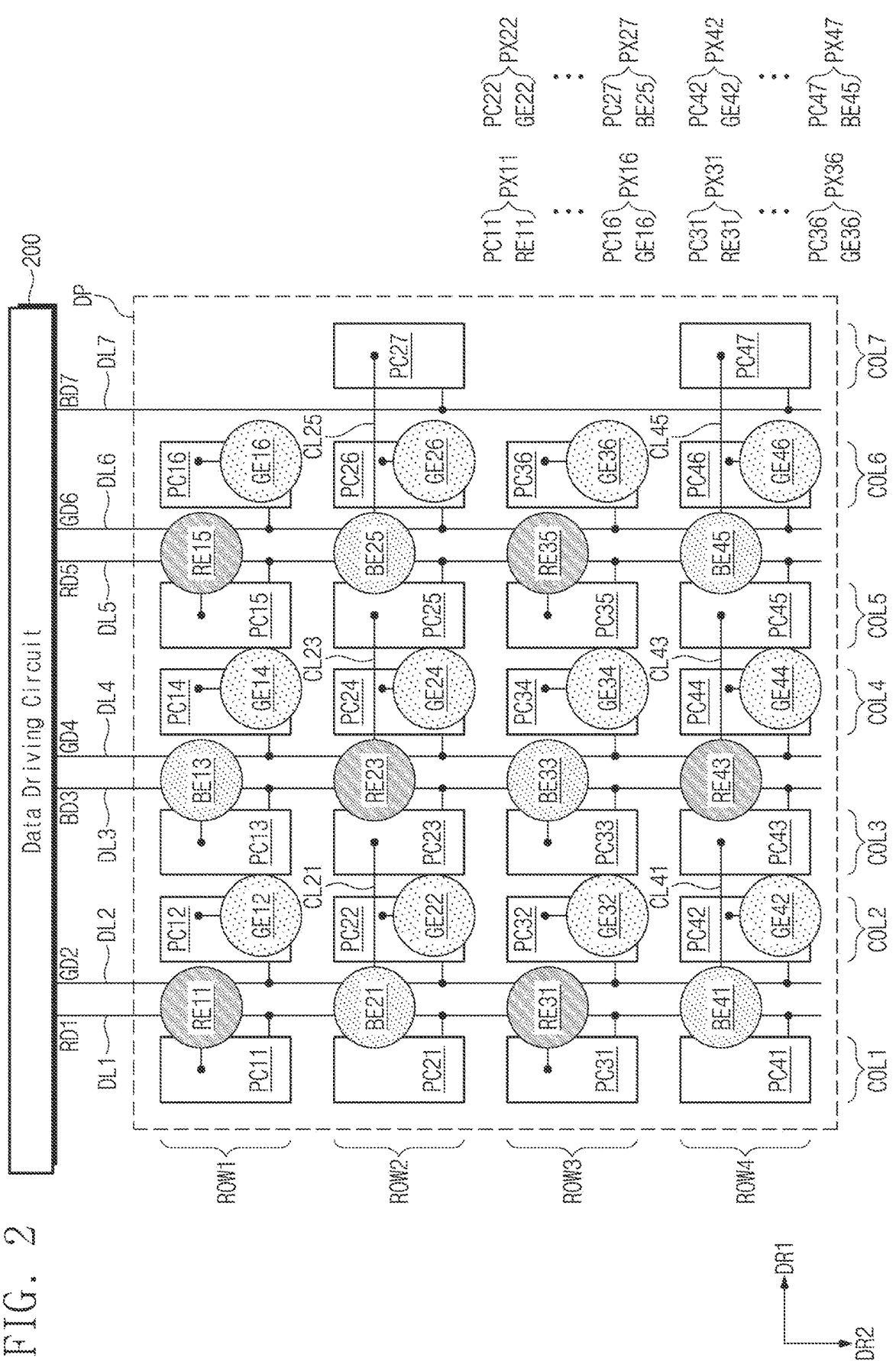
FIG. 2 is a diagram illustrating the arrangement of pixel circuits and first to third light-emitting elements of pixels.

FIG. 2 is a diagram illustrating the arrangement of pixel circuits and light-emitting elements of pixels.

Referring to FIG. 2, the display panel DP includes data lines DL1 to DL7, pixel circuits PC11 to PC16, PC21 to PC27, PC31 to PC36, and PC41 to PC47, first light-emitting elements RE11, RE15, RE23, RE31, RE35, and RE43, second light-emitting elements BE13, BE21, BE25, BE33, BE41, and BE45, and third light-emitting elements GE12, GE14, GE16, GE22, GE24, GE26, GE32, GE34, GE36, GE42, GE44, and GE46.

In one or more embodiments, each of the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46 may be in the shape of a circle.

The sizes and the arrangement of the pixel circuits PC11 to PC16, PC21 to PC27, PC31 to PC36, and PC41 to PC47, the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46 are provided only as an example for better understanding, and the present disclosure is not limited thereto.

Each of the pixel circuits PC11 to PC16, PC21 to PC27, PC31 to PC36, and PC41 to PC47 may be located at a corresponding location among locations defined by first to fourth rows ROW1 to ROW4 and first to seventh columns COL1 to COL7. For example, each of the pixel circuits PC11 to PC16, PC21 to PC27, PC31 to PC36, and PC41 to PC47 may be located at crossing regions of first to fourth rows ROW1 to ROW4 and first to seventh columns COL1 to COL7, respectively.

Each of the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46 may be located at a corresponding location among the locations defined by the first to fourth rows ROW1 to ROW4 and the first to seventh columns COL1 to COL7. For example, each of the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46 may be located at crossing regions of the first to fourth rows ROW1 to ROW4 and the first to seventh columns COL1 to COL7, respectively.

The first to fourth rows ROW1 to ROW4 may be defined sequentially along the second direction DR2. The first to seventh columns COL1 to COL7 may be defined sequentially along the first direction DR1.

The pixel circuits PC11 to PC16, the first light-emitting elements RE11 and RE15, the second light-emitting element BE13, and the third light-emitting elements GE12, GE14, GE16 are located at the first row ROW1.

The pixel circuits PC21 to PC27, the first light-emitting element RE23, the second light-emitting elements BE21 and BE25, and the third light-emitting elements GE22, GE24, and GE26 are located at the second row ROW2.

The pixel circuits PC31 to PC36, the first light-emitting elements RE31 and RE35, the second light-emitting element BE33, and the third light-emitting elements GE32, GE34, and GE36 are located at the third row ROW3.

The pixel circuits PC41 to PC47, the first light-emitting element RE43, the second light-emitting elements BE41 and BE45, and the third light-emitting elements GE42, GE44, and GE46 are located at the fourth row ROW4.

Each of the pixel circuits PC11 to PC16, PC21 to PC27, PC31 to PC36, and PC41 to PC47 may be connected with a corresponding data line among the data lines DL1 to DLm. In one or more embodiments, some of the pixel circuits PC11 to PC16, PC21 to PC27, PC31 to PC36, and PC41 to PC47 are connected with data lines located on the right thereof from among the data lines DL1 to DLm and the others thereof are connected with data lines located on the left thereof from among the data lines DL1 to DLm.

For example, pixel circuits in the odd-numbered column may be connected with a data line located on the right thereof from among the data lines DL1 to DLm, and pixel circuits in the even-numbered column may be connected with a data line located on the left thereof from among the data lines DL1 to DLm.

For example, the pixel circuits PC11, PC21, PC31, and PC41 in the first column are connected with the data line DL1 located on the right thereof. For example, the pixel circuits PC12, PC22, PC32, and PC42 in the second column are connected with the data line DL2 located on the left thereof.

An example in which each of the pixel circuits PC27 and PC47 being odd-numbered pixel circuits is connected with the data line DL7 located on the left thereof, and the present disclosure is not limited thereto. In one or more embodiments, the data line DL7 may be located on the right of the pixel circuits PC27 and PC47.

Each of the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46 is connected with a corresponding pixel circuit among the pixel circuits PC11 to PC16, PC21 to PC27, PC31 to PC36, and PC41 to PC47.

Each of the first light-emitting elements RE11 and RE15, the second light-emitting element BE13, and the third light-emitting elements GE12, GE14, and GE16 located at the first row ROW1 may be connected with a pixel circuit overlapping each light-emitting element in a plan view from among the pixel circuits PC11 to PC16. For example, the first light-emitting element RE11 is connected with the pixel circuit PC11, the third light-emitting element GE12 is connected with the pixel circuit PC12, and the second light-emitting element BE13 is connected with the pixel circuit PC13.

The second light-emitting element BE21, the first light-emitting element RE23, and the second light-emitting element BE25 located at the second row ROW2 are respectively connected with the pixel circuits PC23, PC25, and PC27 located at the second row ROW2 through connection electrodes CL21, CL23, and CL25. The second light-emitting element BE21, the first light-emitting element RE23, and the second light-emitting element BE25 are located to be spaced from the pixel circuits PC23, PC25, and PC27, respectively. That is, the second light-emitting element BE21, the first light-emitting element RE23, and the second light-emitting element BE25 do not overlap the pixel circuits PC23, PC25, and PC27 in a plan view.

Each of the third light-emitting elements GE22, GE24, and GE26 located at the second row ROW2 may be connected with a pixel circuit overlapping each third light-emitting element in a plan view from among the pixel circuits PC21 to PC27. For example, the third light-emitting element GE22 is connected with the pixel circuit PC22, the third light-emitting element GE24 is connected with the pixel circuit PC24, and the third light-emitting element GE26 is connected with the pixel circuit PC26.

Each of the first light-emitting elements RE31 and RE35, the second light-emitting element BE33, and the third light-emitting elements GE32, GE34, and GE36 located at the third row ROW3 may be connected with a pixel circuit overlapping each light-emitting element in a plan view from among the pixel circuits PC31 to PC36. For example, the first light-emitting element RE31 is connected with the pixel circuit PC31, the third light-emitting element GE32 is connected with the pixel circuit PC32, and the second light-emitting element BE33 is connected with the pixel circuit PC33.

The second light-emitting element BE41, the first light-emitting element RE43, and the second light-emitting element BE45 located at the fourth row ROW4 are respectively connected with the pixel circuits PC43, PC45, and PC47 located at the fourth row ROW4 through connection electrodes CL41, CL43, and CL45.

Each of the third light-emitting elements GE42, GE44, and GE46 located at the fourth row ROW4 may be connected with a pixel circuit overlapping each third light-emitting element in a plan view from among the pixel circuits PC41 to PC47. For example, the third light-emitting element GE42 is connected with the pixel circuit PC42, the third light-emitting element GE44 is connected with the pixel circuit PC44, and the third light-emitting element GE46 is connected with the pixel circuit PC46.

In one or more embodiments, each of the pixels PX11 to PXnm illustrated in FIG. 1 may include one pixel circuit and one light-emitting element.

For example, the pixel PX11 illustrated in FIG. 1 may include the pixel circuit PC11 and the first light-emitting element RE11. The pixel PX16 may include the pixel circuit PC16 and the third light-emitting element GE16.

The pixel PX22 may include the pixel circuit PC22 and the third light-emitting element GE22. The pixel PX27 may include the pixel circuit PC27 and the second light-emitting element BE25.

The pixel PX31 may include the pixel circuit PC31 and the first light-emitting element RE31. The pixel PX36 may include the pixel circuit PC36 and the third light-emitting element GE36.

The pixel PX42 may include the pixel circuit PC42 and the third light-emitting element GE42. The pixel PX47 may include the pixel circuit PC47 and the second light-emitting element BE45.

In one or more embodiments, each of the first light-emitting elements RE11, RE15, RE23, RE31, RE35, and RE43 emits a first color light. In one or more embodiments, each of the second light-emitting elements BE13, BE21, BE25, BE33, BE41, and BE45 emits a second color light. In one or more embodiments, each of the third light-emitting elements GE12, GE14, GE16, GE22, GE24, GE26, GE32, GE34, GE36, GE42, GE44, and GE46 emits a third color light. In one or more embodiments, the first to third color lights may be different respective color lights.

In one or more embodiments, the first color light, the second color light, and the third color light may be red, blue, and green, respectively. However, the present disclosure is not limited thereto. In one or more other embodiments, the first to third color lights may be of various colors, such as a red, a blue, a green, a white, a cyan, a magenta, and a yellow.

The data-driving circuit 200 outputs first color data signals RD1 and RD5 to the data lines DL1 and DL5, respectively, outputs second color data signals BD3 and BD7 to the data lines DL3 and DL7, respectively, and outputs third color data signals GD2, GD4, and GD6 to the data lines DL2, DL4, and DL6, respectively.

In one or more embodiments, the first color data signals RD1 and RD5 may be red data signals, the second color data signals BD3 and BD7 may be blue data signals, and the third color data signals GD2, GD4, and GD6 may be green data signals. Colors of data signals provided to the data lines DL1 to DL7 may be determined based on emission colors of the first light-emitting elements RE11, RE15, RE23, RE31, RE35, and RE43, the second light-emitting elements BE13, BE21, BE25, BE33, BE41, and BE45, and the third light-emitting elements GE12, GE14, GE16, GE22, GE24, GE26, GE32, GE34, GE36, GE42, GE44, and GE46.

As the data-driving circuit 200 outputs only a data signal corresponding to a corresponding color to each of the data lines DL1 to DL7, power consumption may be reduced.

For example, the first color data signal RD1 provided to the data line DL1 may be respectively transferred to the first light-emitting elements RE11 and RE31 through the pixel circuits PC11 and PC31 located at the first column COL1.

The third color data signal GD2 provided to the data line DL2 may be respectively transferred to the third light-emitting elements GE12, GE22, GE32 and GE42 through the pixel circuits PC12, PC22, PC32, and PC42 located at the second column COL2.

The second color data signal BD3 provided to the data line DL3 may be respectively transferred to the second light-emitting elements BE13, BE21, BE33, and BE41 through the pixel circuits PC13, PC23, the PC33 and PC43 located at the third column COL3.

The second color data signal GD4 provided to the data line DL4 may be respectively transferred to the third light-emitting elements GE14, GE24, GE34, and GE44 through the pixel circuits PC14, PC24, PC34, and PC44 located at the fourth column COL4.

The first color data signal RD5 provided to the data line DL5 may be respectively transferred to the first light-emitting elements RE15, RE23, RE35, and RE43 through the pixel circuits PC15, PC25, PC35, and PC45 located at the fifth column COL5.

The third color data signal GD6 provided to the data line DL6 may be respectively transferred to the third light-emitting elements GE16, GE26, GE36, and GE46 through the pixel circuits PC16, PC26, PC36, and PC46 located at the sixth column COL6.

The second color data signal BD7 provided to the data line DL7 may be respectively transferred to the second light-emitting elements BE25 and BE45 through the pixel circuits PC27 and PC47 located at the seventh column COL7.

Figure 3:
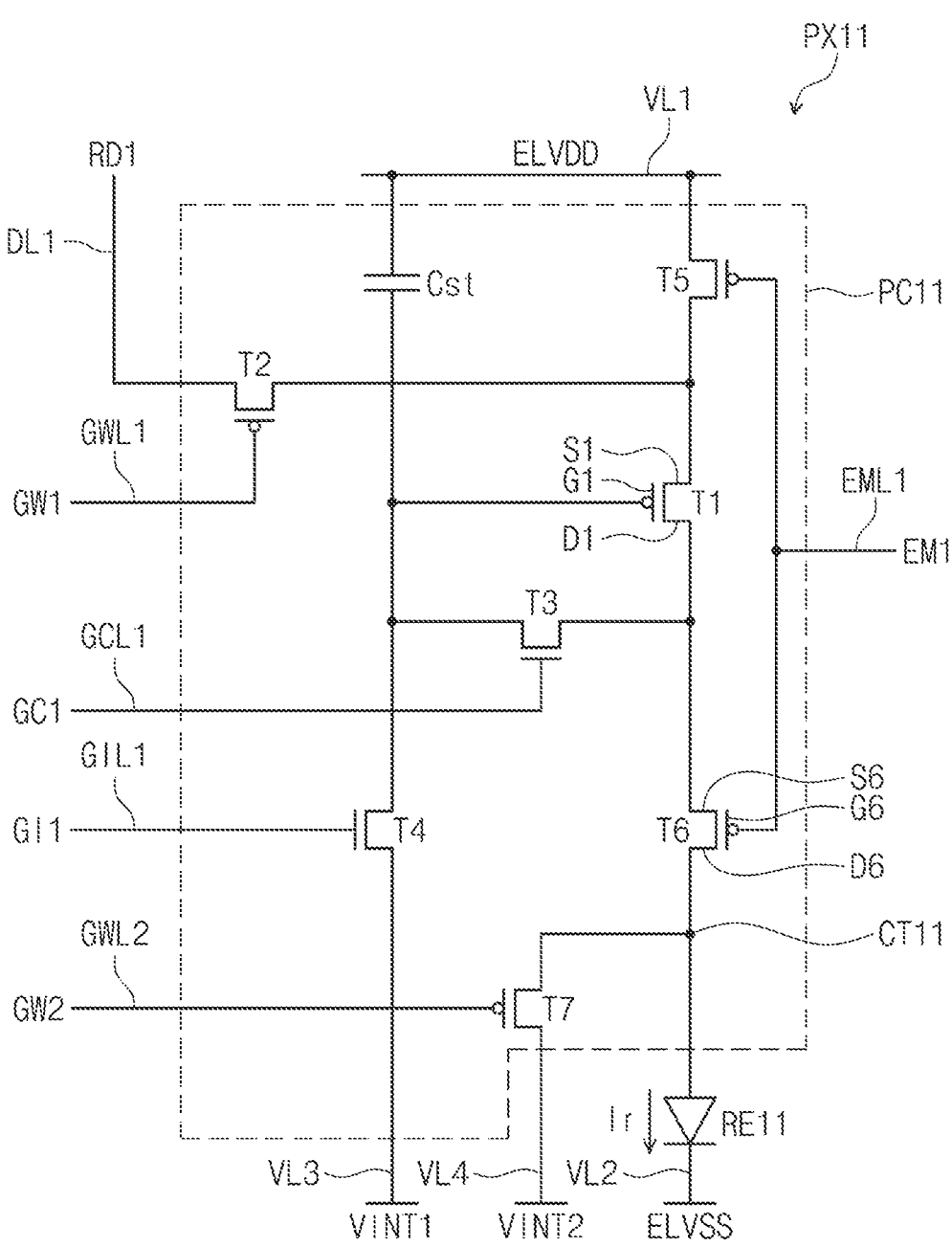
FIG. 3 is a circuit diagram of a pixel according to one or more embodiments of the present disclosure.

FIG. 3 is a circuit diagram of the pixel PX11 according to one or more embodiments of the present disclosure.

The pixel circuit PC11 and the first light-emitting element RE11 constituting the pixel PX11 are illustrated in FIG. 3 as an example. The pixel circuits PC12 to PC16, PC22, PC24, PC26, PC31 to PC36, PC42, PC44, and PC46 may include the same circuit configuration as the pixel circuit PC11 illustrated in FIG. 3.

Referring to FIG. 3, the pixel PX11 includes the pixel circuit PC11 and the first light-emitting element RE11. In one or more embodiments, the first light-emitting element RE11 may be a light-emitting diode. The first light-emitting element RE11 of the pixel PX11 may emit a first color light (e.g., a red light).

In one or more embodiments, the pixel circuit PC11 may include at least one transistor and at least one capacitor. The pixel circuit PC11 illustrated in FIG. 3 includes first to seventh transistors T1, T2, T3, T4, T5, T6, and T7, and a capacitor Cst. The pixel circuit PC11 illustrated in FIG. 3 is only an example. For example, the configuration of the pixel circuit PC11 may be modified and implemented.

In one or more embodiments, the third and fourth transistors T3 and T4 among the first to seventh transistors T1 to T7 are N-type transistors that use an oxide semiconductor as a semiconductor layer, and the first, second, fifth, sixth, and seventh transistors T1, T2, T5, T6, and T7 are P-type transistors, each of which includes a low-temperature polycrystalline silicon (LTPS) semiconductor layer. However, the present disclosure is not limited thereto. In one or more embodiments, all of the first to seventh transistors T1 to T7 may be P-type transistors or N-type transistors. In one or more embodiments, at least one of the first to seventh transistors T1 to T7 may be an N-type transistor, and the rest thereof may be P-type transistors.

In one or more embodiments, the pixel circuit PC11 may be electrically connected with one data line DL1, four scan lines GIL1, GCL1, GWL1, and GWL2, and one emission control line EML1. Each of the scan lines GL1 to GLn illustrated in FIG. 1 may include a plurality of scan lines. In one or more embodiments, the scan line GL1 illustrated in FIG. 1 may include four scan lines GIL1, GCL1, GWL1, and GWL2.

The scan lines GIL1, GCL1, GWL1, and GWL2 may respectively transfer scan signals GI1, GC1, GW1, and GW2, and the emission control line EML1 may transfer an emission control signal EM1. The data line DL1 transfers the first color data signal RD1. The first color data signal RD1 may have a voltage level corresponding to the image signal RGB input to the display device DD (refer to FIG. 1). First to fourth driving voltage lines VL1, VL2, VL3, and VL4 may respectively transfer a first driving voltage ELVDD, a second driving voltage ELVSS, a first initialization voltage VINT1, and a second initialization voltage VINT2.

The first transistor T1 includes a first electrode S1 connected with the first driving voltage line VL1 through the fifth transistor T5, a second electrode D1 electrically connected with an anode of the first light-emitting element RE11 through the sixth transistor T6, and a gate electrode G1 connected with a first end of the capacitor Cst.

The second transistor T2 includes a first electrode connected with the data line DL1, a second electrode connected with the first electrode S1 of the first transistor T1, and a gate electrode connected with the scan line GWL1. The second transistor T2 may be turned on in response to the scan signal GW1 transferred through the scan line GWL1 and may transfer the data signal RD1 (e.g., the first color data signal RD1) transferred through the data line DL1 to the first electrode S1 of the first transistor T1. The data signal RD1 transferred from the data line DL1 may be a second color signal.

The third transistor T3 includes a first electrode connected with the gate electrode G1 of the first transistor T1, a second electrode connected with the second electrode D1 of the first transistor T1, and a gate electrode connected with the scan line GCL1. The third transistor T3 may be turned on in response to the scan signal GC1 transferred through the scan line GCL1, and thus, the gate electrode G1 and the second electrode D1 of the first transistor T1 may be connected with each other, that is, the first transistor T1 may be diode-connected.

The fourth transistor T4 includes a first electrode connected with the gate electrode G1 of the first transistor T1, a second electrode connected with the third driving voltage line VL3 through which the first initialization voltage VINT1 is transferred, and a gate electrode connected with the scan line GIL1. The fourth transistor T4 may be turned on in response to the scan signal GI1 transferred through the scan line GIL1 such that the first initialization voltage VINT1 is supplied to the gate electrode G1 of the first transistor T1. Accordingly, a voltage of the gate electrode G1 of the first transistor T1 may be initialized. This operation may be referred to as an "an initialization operation".

The fifth transistor T5 includes a first electrode connected with the first driving voltage line VL1, a second electrode connected with the first electrode S1 of the first transistor T1, and a gate electrode connected with the emission control line EML1.

The sixth transistor T6 includes a first electrode S6 connected with the second electrode D1 of the first transistor T1, a second electrode D6 connected with an anode of the first light-emitting element RE11, and a gate electrode G6 connected with the emission control line EML1. The second electrode D6 of the sixth transistor T6 may be connected with the anode of the first light-emitting element RE11 through a connection node CT11.

The fifth transistor T5 and the sixth transistor T6 may be concurrently or substantially simultaneously turned on in response to the emission control signal EM1 transferred through the emission control line EML1. As the fifth transistor T5 and the sixth transistor T6 are turned on, a current path may be formed from the first driving voltage line VL1 to the first light-emitting element RE11 through the fifth transistor T5, the first transistor T1, and the sixth transistor T6. In this case, the current flowing through the first transistor T1 may correspond to charges charged in the capacitor Cst. Accordingly, a current Ir corresponding to the data signal RD1 may be transferred to the first light-emitting element RE11. In other words, the data signal RD1 may be converted into the current Ir through the pixel circuit PC11 so as to be provided to the first light-emitting element RE11.

The seventh transistor T7 includes a first electrode connected with the second electrode D6 of the sixth transistor T6, a second electrode connected with the fourth driving voltage line VL4, and a gate electrode connected with the scan line GWL2. The seventh transistor T7 may be turned on in response to the scan signal GW2 transferred through the scan line GWL2, and may initialize the anode of the first light-emitting element RE11 with the second initialization voltage VINT2 from the fourth driving voltage line VL4.

The first end of the capacitor Cst is connected with the gate electrode G1 of the first transistor T1 as described above, and a second end of the capacitor Cst is connected with the first driving voltage line VL1. A cathode of the first light-emitting element RE11 may be connected with the second driving voltage line VL2 through which the second driving voltage ELVSS is transferred.

Figure 4:
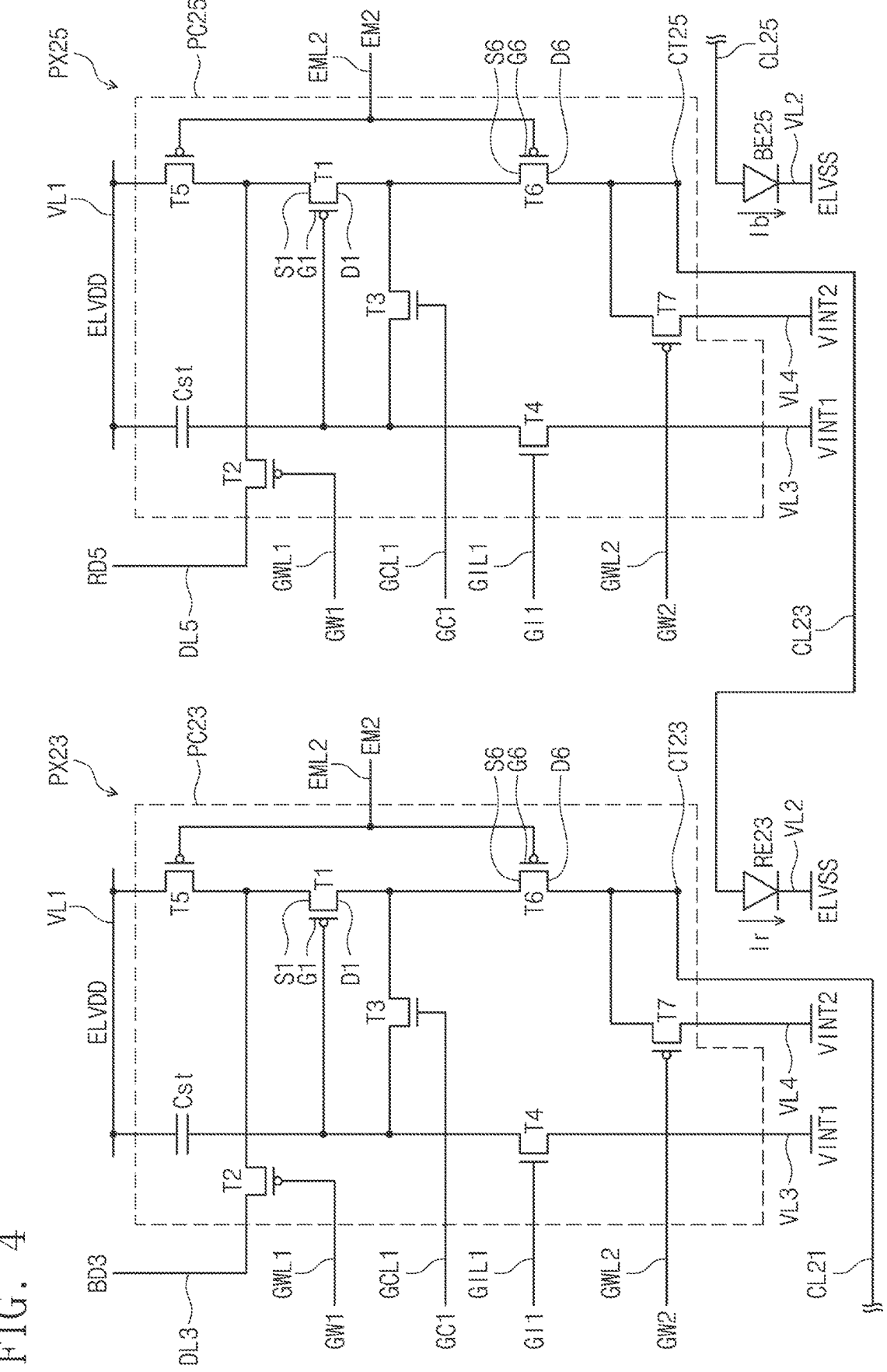
FIG. 4 is a circuit diagram of a pixel according to one or more embodiments of the present disclosure.

FIG. 4 is a circuit diagram of the pixel PX23 and the pixel PX25 according to one or more embodiments of the present disclosure.

Referring to FIGS. 2 and 4, the pixel PX23 includes the pixel circuit PC23 and the second light-emitting element BE21. The pixel PX25 includes the pixel circuit PC25 and the first light-emitting element RE23.

The pixel circuit PC23 of the pixel PX23 and the pixel circuit PC25 of the pixel PX25 illustrated in FIG. 4 may include a circuit configuration similar to that of the pixel circuit PC11 of the pixel PX11 illustrated in FIG. 3. The same reference numerals/signs are used for components, which are identical to components of the pixel circuit PC11 of the pixel PX11 illustrated in FIG. 3, from among components of the pixel circuit PC23 of the pixel PX23 and components of the pixel circuit PC25 of the pixel PX25 illustrated in FIG. 4, and additional, repetitive descriptions are omitted to avoid redundancy.

Referring to FIGS. 2 and 4, the first light-emitting element RE23 located adjacent to (or partially overlapping) the pixel circuit PC23 of the pixel PX23 may be a light-emitting element that emits a first color light (e.g., a red light). In one or more embodiments, the pixel circuit PC23 and the first light-emitting element RE23 of the pixel PX23 may be electrically separated from each other.

The second light-emitting element BE25 located adjacent to (or partially overlapping) the pixel circuit PC25 of the pixel PX25 may be a light-emitting element that emits a second color light (e.g., a blue light). In one or more embodiments, the pixel circuit PC25 and the second light-emitting element BE25 of the pixel PX25 may be electrically separated from each other.

In one or more embodiments, the first light-emitting element RE23 is electrically connected with the pixel circuit PC25 through a connection electrode CL23 and a connection node CT25. Accordingly, the first color data signal RD5 transferred through the data line DL5 may be converted into the current Ir through the pixel circuit PC25 so as to be provided to the first light-emitting element RE23.

In one or more embodiments, the second light-emitting element BE25 located to (or partially overlapping) the pixel circuit PC25 of the pixel PX25 may be connected with the pixel circuit PC27 through a connection electrode CL25.

Figure 5:
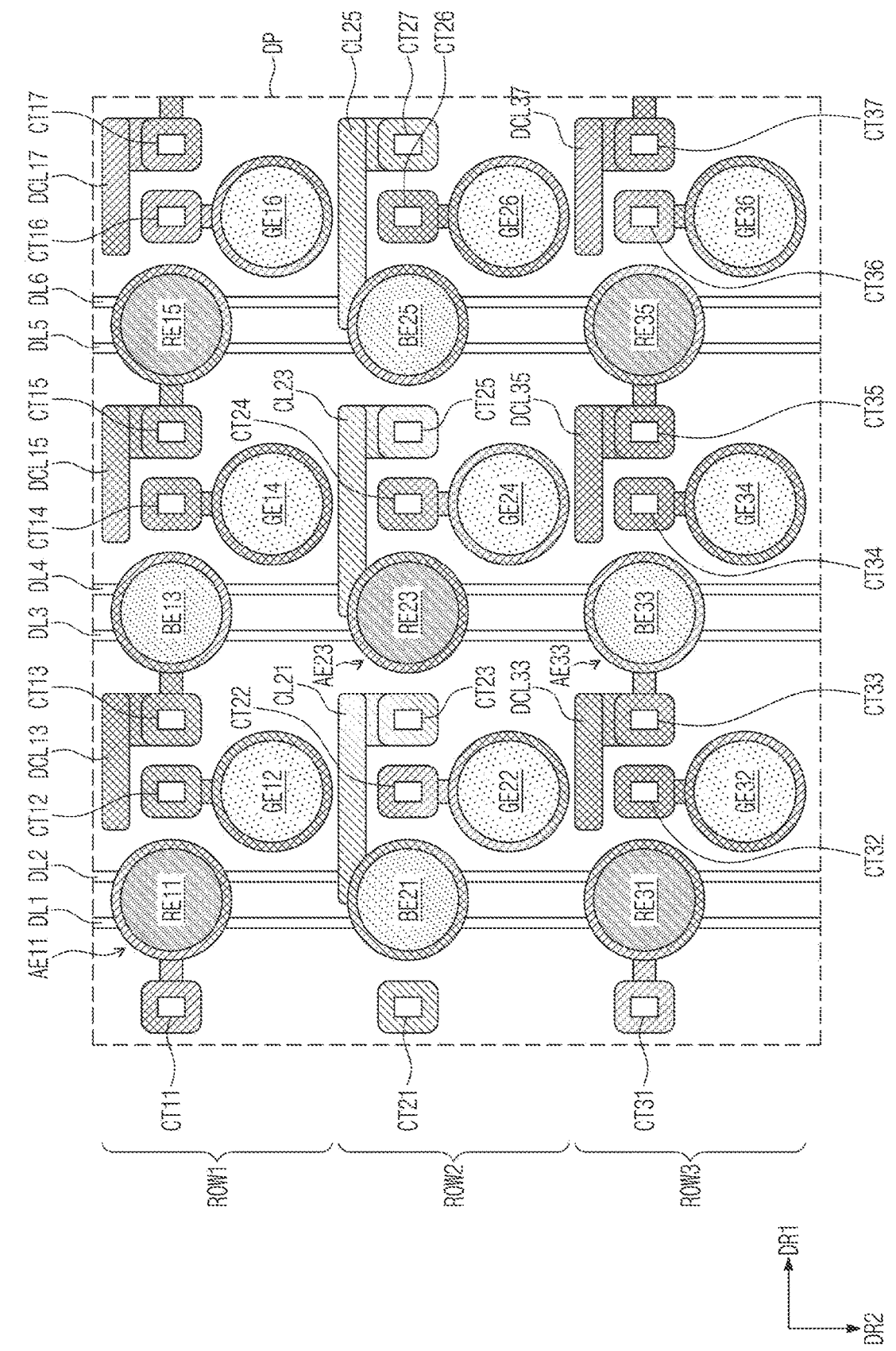
FIG. 5 is a plan view of a display panel according to one or more embodiments of the present disclosure.

FIG. 5 is a plan view of the display panel DP according to one or more embodiments of the present disclosure.

FIG. 5 shows only some of pixels illustrated in FIG. 2. The plan view illustrated in FIG. 5 is only an example, and the present disclosure is not limited thereto.

Referring to FIG. 5, the first light-emitting elements RE11 and RE15, the second light-emitting element BE13, and the third light-emitting elements GE12, GE14, and GE16 are located at the first row ROW1. The first light-emitting element RE23, the second light-emitting elements BE21 and BE25, and the third light-emitting elements GE22, GE24, and GE26 are located at the second row ROW2. The first light-emitting elements RE31 and RE35, the second light-emitting element BE33, and the third light-emitting elements GE32, GE34, and GE36 are located at the third row ROW3.

Referring to FIGS. 2 and 5, the first light-emitting element RE11, the third light-emitting element GE12, the second light-emitting element BE13, the third light-emitting element GE14, the first light-emitting element RE15, and the third light-emitting element GE16 located at the first row ROW1 are respectively electrically connected with the pixel circuits PC11 to PC16 through connection nodes CT11 to CT16.

The second light-emitting element BE21, the third light-emitting element GE22, the first light-emitting element RE23, the third light-emitting element GE24, the second light-emitting element BE25, and the third light-emitting element GE26 located at the second row ROW2 are respectively electrically connected with the pixel circuits PC23, PC22, PC25, PC24, PC27, and PC26.

The first light-emitting element RE31, the third light-emitting element GE32, the second light-emitting element BE33, the third light-emitting element GE34, the first light-emitting element RE35, and the third light-emitting element GE36 are respectively electrically connected with the pixel circuits PC31 to PC36 through connection nodes CT31 to CT36.

The first light-emitting elements RE11 and RE31 and the second light-emitting element BE21 may overlap the data lines DL1 and DL2 in a plan view.

The second light-emitting elements BE13 and BE33 and the first light-emitting element RE23 may overlap the data lines DL3 and DL4 in a plan view.

The first light-emitting elements RE15 and RE35 and the second light-emitting element BE25 may overlap the data lines DL5 and DL6 in a plan view.

In one or more embodiments, the connection node CT21 may be a dummy component that is not electrically connected with any other component.

In one or more embodiments, the second light-emitting element BE21 located at the second row ROW2 may be connected with the pixel circuit PC23 through the connection electrode CL21 and the connection node CT23. The first light-emitting element RE23 may be connected with the pixel circuit PC25 through the connection electrode CL23 and the connection node CT25. The second light-emitting element BE25 may be connected with the pixel circuit PC27 through the connection electrode CL25 and the connection node CT27.

In one or more embodiments, the connection electrode CL21 extends from the second light-emitting element BE21 and is located between the third light-emitting elements GE12 and GE22. The connection electrode CL23 extends from the first light-emitting element RE23 and is located between the third light-emitting elements GE14 and GE24. The connection electrode CL25 extends from the second light-emitting element BE25 and is located between the third light-emitting elements GE16 and GE26.

In one or more embodiments, dummy connection electrodes DCL13, DCL15, and DCL17 are respectively electrically connected with connection nodes CT13, CT15, and CT17 located at the first row ROW1. Each of the dummy connection electrodes DCL13, DCL15, and DCL17 may be connected with one side of a corresponding connection node among the connection nodes CT13, CT15, and CT17, and may be formed in a shape to protrude in a direction facing away from the first direction DR1. In one or more embodiments, the dummy connection electrodes DCL13, DCL15, and DCL17 may be parallel to the connection electrodes CL21, CL23, and CL25.

In one or more embodiments, the dummy connection electrode DCL13 may be formed in a shape to protrude from the second light-emitting element BE13, and the dummy connection electrode DCL15 may be formed in a shape to protrude from the first light-emitting element RE15.

In one or more embodiments, dummy connection electrodes DCL33, DCL35, and DCL37 are respectively electrically connected with connection nodes CT33, CT35, and CT37 located at the third row ROW3. Each of the dummy connection electrodes DCL33, DCL35, and DCL37 may be connected with one side of a corresponding connection node among the connection nodes CT33, CT35, and CT37, and may be formed in a shape to protrude in a direction facing away from the first direction DR1. In one or more embodiments, the dummy connection electrodes DCL13, DCL15, and DCL17 may be parallel to the connection electrodes CL21, CL23, and CL25.

In one or more embodiments, the dummy connection electrode DCL33 may be formed in a shape to protrude from the second light-emitting element BE33, and the dummy connection electrode DCL35 may be formed in a shape to protrude from the first light-emitting element RE35.

In one or more embodiments, the dummy connection electrode DCL33 is located between the third light-emitting elements GE22 and GE32. The dummy connection electrode DCL35 is located between the third light-emitting elements GE24 and GE34. The dummy connection electrode DCL37 is located between the third light-emitting elements GE26 and GE36.

In one or more embodiments, the dummy connection electrodes DCL13, DCL15, and DCL17 may be similar in shape to the connection electrodes CL21, CL23, and CL25. Also, the dummy connection electrodes DCL33, DCL35, and DCL37 may be similar in shape to the connection electrodes CL21, CL23, and CL25.

For example, a coupling capacitance may be formed between the second light-emitting element BE21 and the third light-emitting element GE22 by the connection electrode CL21 located at the second row ROW2. Also, a coupling capacitance may be formed between the first light-emitting element RE23 and the third light-emitting element GE24 by the connection electrode CL23 located at the second row ROW2.

A coupling capacitance may be formed between the second light-emitting element BE13 and the third light-emitting element GE12 by the dummy connection electrode DCL13 located at the first row ROW1. A coupling capacitance may be formed between the first light-emitting element RE15 and the third light-emitting element GE14 by the dummy connection electrode DCL15 located at the first row ROW1.

A coupling capacitance may be formed between the second light-emitting element BE33 and the third light-emitting element GE32 by the dummy connection electrode DCL33 located at the third row ROW3. A coupling capacitance may be formed between the first light-emitting element RE35 and the third light-emitting element GE34 by the dummy connection electrode DCL35 located at the third row ROW3.

Accordingly, a coupling capacitance difference between the first, second, and third rows ROW1, ROW2, and ROW3 may be reduced or minimized.

Figure 6:
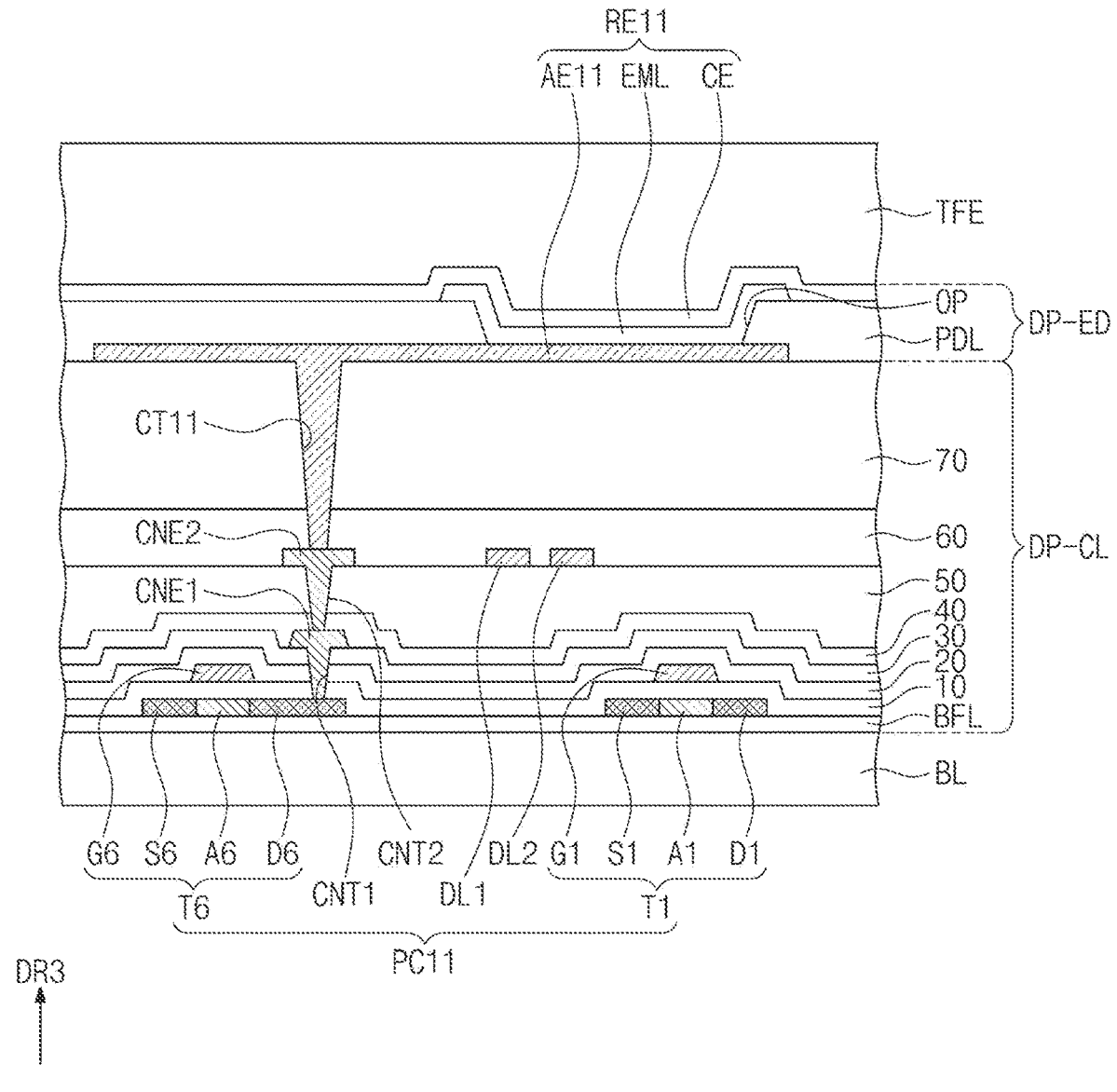
FIG. 6 is a cross-sectional view illustrating a portion of a first light-emitting element and a pixel circuit of a display panel according to one or more embodiments of the present disclosure.

FIG. 6 is a cross-sectional view illustrating a portion of the first light-emitting element RE11 and the pixel circuit PC11 of the display panel DP according to one or more embodiments of the present disclosure.

Referring to FIG. 6, the display panel DP may include a base layer BL, and a circuit element layer DP-CL, a display element layer DP-ED, and a thin film encapsulation layer TFE located on the base layer BL. The display panel DP may further include functional layers, such as a refractive index control layer. The circuit element layer DP-CL at least includes a plurality of insulating layers and a circuit element. Below, the insulating layers may include an organic layer and/or an inorganic layer.

An insulating layer, a semiconductor layer, and a conductive layer are formed through processes, such as a coating process and a deposition process. Afterwards, the insulating layer, the semiconductor layer, and the conductive layer may be selectively patterned through photolithography and etching processes. A semiconductor pattern, a conductive pattern, and a signal line are formed through the above processes. Patterns located on the same layer are formed through the same process.

The base layer BL may include a synthetic resin layer. The synthetic resin layer may include a thermosetting resin material. For example, the synthetic resin layer may be a polyimide-based resin layer, and the material thereof is not particularly limited. The synthetic resin layer may include at least one of acrylic resin, methacrylic resin, polyisoprene, vinyl resin, epoxy resin, urethane resin, cellulose resin, siloxane resin, polyamide resin, and perylene resin. In addition, the base layer BL may include a glass substrate, a metal substrate, an organic/inorganic composite substrate, etc.

At least one inorganic layer is formed on an upper surface of the base layer BL. The inorganic layer may include at least one of aluminum oxide, titanium oxide, silicon oxide, silicon oxynitride, zirconium oxide, and hafnium oxide. The inorganic layer may be formed of multiple layers. At least one of the multiple inorganic layers may constitute one buffer layer BFL.

The buffer layer BFL improves a bonding force between the base layer BL and the semiconductor pattern and/or the conductive pattern. The buffer layer BFL may include a silicon oxide layer and a silicon nitride layer. The silicon oxide layer and the silicon nitride layer may be alternately stacked.

The semiconductor pattern is located on the buffer layer BFL. The semiconductor pattern may be directly located on the buffer layer BFL. The semiconductor pattern may include a silicon semiconductor. The semiconductor pattern may include low-temperature polycrystalline silicon (LTPS). However, the present disclosure is not limited thereto. For example, the semiconductor pattern may include amorphous silicon.

An electrical property of the semiconductor pattern varies depending on whether it is doped or not. The semiconductor pattern may include a doped area and an undoped area. The doped area may be doped with an N-type dopant or a P-type dopant. A P-type transistor includes a doped area doped with the P-type dopant.

The doped area has higher conductivity than the undoped area and acts as substantially an electrode or a signal line. The undoped area corresponds substantially to an active (or channel) of a transistor. In other words, a portion of the semiconductor pattern may be the active of the transistor, another portion thereof may be a first electrode (e.g., a source electrode) or a second electrode (e.g., a drain electrode) of the transistor, and the other portion thereof may be a connection electrode or a connection signal line (or a connection electrode).

As illustrated in FIG. 6, a first electrode S1, an active A1, and a second electrode D1 of the first transistor T1 are formed from the semiconductor pattern. The first electrode S1 and the second electrode D1 of the first transistor T1 extend from the active A1 in opposite directions. Also, a first electrode S6, an active A6, and a second electrode D6 of the sixth transistor T6 are formed from the semiconductor pattern. The first electrode S6 and the second electrode D6 of the sixth transistor T6 extend from the active A6 in opposite directions. In one or more embodiments, the first electrode S6 of the sixth transistor T6 may be connected with the second electrode D1 of the first transistor T1.

As illustrated in FIG. 3, the first electrode S6 of the sixth transistor T6 may be electrically connected with the second electrode D1 of the first transistor T1.

A first insulating layer 10 is located on the buffer layer BFL. The first insulating layer 10 overlap the pixels PX11 to PX47 illustrated in FIG. 2 in common and covers the semiconductor patterns. The first insulating layer 10 may be an inorganic layer and/or an organic layer, and may have a single-layer structure or a multi-layer structure. The first insulating layer 10 may include at least one of an aluminum oxide, a titanium oxide, a silicon oxide, a silicon oxynitride, a zirconium oxide, and a hafnium oxide. In one or more embodiments, the first insulating layer 10 may be a silicon oxide layer having a single-layer structure. As well as the first insulating layer 10, an insulating layer of the circuit element layer DP-CL to be described later may be an inorganic layer and/or an organic layer and may have a single-layer structure or a multi-layer structure. The inorganic layer may include at least one of the materials described above.

A gate electrode G1 of the first transistor T1 is located on the first insulating layer 10. The gate electrode G1 may be a part of a metal pattern. The gate electrode G1 of the first transistor T1 overlaps the active A1 of the first transistor T1. The gate electrode G1 of the first transistor T1 may be used as a mask in the process of doping the semiconductor pattern.

A second insulating layer 20 covering the gate electrode G1 is located on the first insulating layer 10. The second insulating layer 20 may overlap the pixels PX11 to PXnm (refer to FIG. 1) in common. The second insulating layer 20 may be an inorganic layer and/or an organic layer and may have a single-layer structure or a multi-layer structure. In one or more embodiments, the second insulating layer 20 may be a silicon oxide layer having a single-layer structure.

A third insulating layer 30 is located on the second insulating layer 20. In one or more embodiments, the third insulating layer 30 may be a silicon oxide layer having a single-layer structure.

A first connection electrode CNE1 may be located on the third insulating layer 30. The first connection electrode CNE1 may be connected with the second electrode D6 of the sixth transistor T6 through a contact hole CNT1 penetrating the first to third insulating layers 10 to 30.

A fourth insulating layer 40 that covers the first connection electrode CNE1 may be located on the third insulating layer 30. The fourth insulating layer 40 may be a silicon oxide layer having a single-layer structure. A fifth insulating layer 50 is located on the fourth insulating layer 40. The fifth insulating layer 50 may be an organic layer. A second connection electrode CNE2 may be located on the fifth insulating layer 50. The second connection electrode CNE2 may be connected with the first connection electrode CNE1 through a contact hole CNT2 penetrating the fourth insulating layer 40 and the fifth insulating layer 50.

A sixth insulating layer 60 covering the second connection electrode CNE2 is located on the fifth insulating layer 50. The sixth insulating layer 60 may be an organic layer. A seventh insulating layer 70 is located on the sixth insulating layer 60. An anode AE11 is located on the seventh insulating layer 70. The anode AE11 is connected with the second connection electrode CNE2 through the connection node CT11 penetrating the sixth insulating layer 60 and the seventh insulating layer 70. An opening OP is defined in a pixel defining layer PDL. The opening OP of the pixel defining layer PDL exposes at least a portion of the anode AE11.

An emission layer EML is located on the anode AE11. The emission layer EML may be located only in an area corresponding to the opening OP. The emission layer EML may be independently formed for each of the pixels PX11 to PXnm (refer to FIG. 1).

One or more embodiments in which the emission layer EML is patterned are illustrated, but the emission layer EML may be located in the plurality of pixels PX11 to PXnm in common. In this case, the emission layer EML may generate a white light or a blue light. Also, the emission layer EML may have a multi-layer structure. A cathode CE is located on the emission layer EML. The cathode CE is located in the pixels PX11 to PXnm in common.

In one or more embodiments, a hole control layer may be located between the anode AE11 and the emission layer EML. Also, an electron control layer may be located between the emission layer EML and the cathode CE.

The thin film encapsulation layer TFE is located on the cathode CE. The thin film encapsulation layer TFE is located in the pixels PX11 to PXnm in common. In one or more embodiments, the thin film encapsulation layer TFE directly covers the cathode CE. In one or more embodiments of the present disclosure, a capping layer that directly covers the cathode CE may be further located.

The thin film encapsulation layer TFE includes at least one inorganic layer or at least one organic layer. In one or more embodiments of the present disclosure, the thin film encapsulation layer TFE may include two inorganic layers and an organic layer located therebetween. In one or more embodiments of the present disclosure, the thin film encapsulation layer TFE may include a plurality of inorganic layers and a plurality of organic layers, which are alternately stacked.

The encapsulation inorganic layer protects the first light-emitting element RE11 from moisture or oxygen, and the encapsulation organic layer protects the first light-emitting element RE11 from foreign objects, such as dust particles. The encapsulation inorganic layer may include a silicon nitride layer, a silicon oxynitride layer, a silicon oxide layer, a titanium oxide layer, an aluminum oxide layer, etc., but the present disclosure is not particularly limited thereto. The encapsulation organic layer may include an acryl-based organic layer, and the present disclosure is not particularly limited thereto.

In one or more embodiments, the data lines DL1 and DL2 may be located on the fifth insulating layer 50. However, the present disclosure is not limited thereto. In one or more embodiments, the data lines DL1 and DL2 may be located on the sixth insulating layer 60. The data lines DL1 and DL2 may overlap the anode AE11 of the first light-emitting element RE11.

Figure 7A:
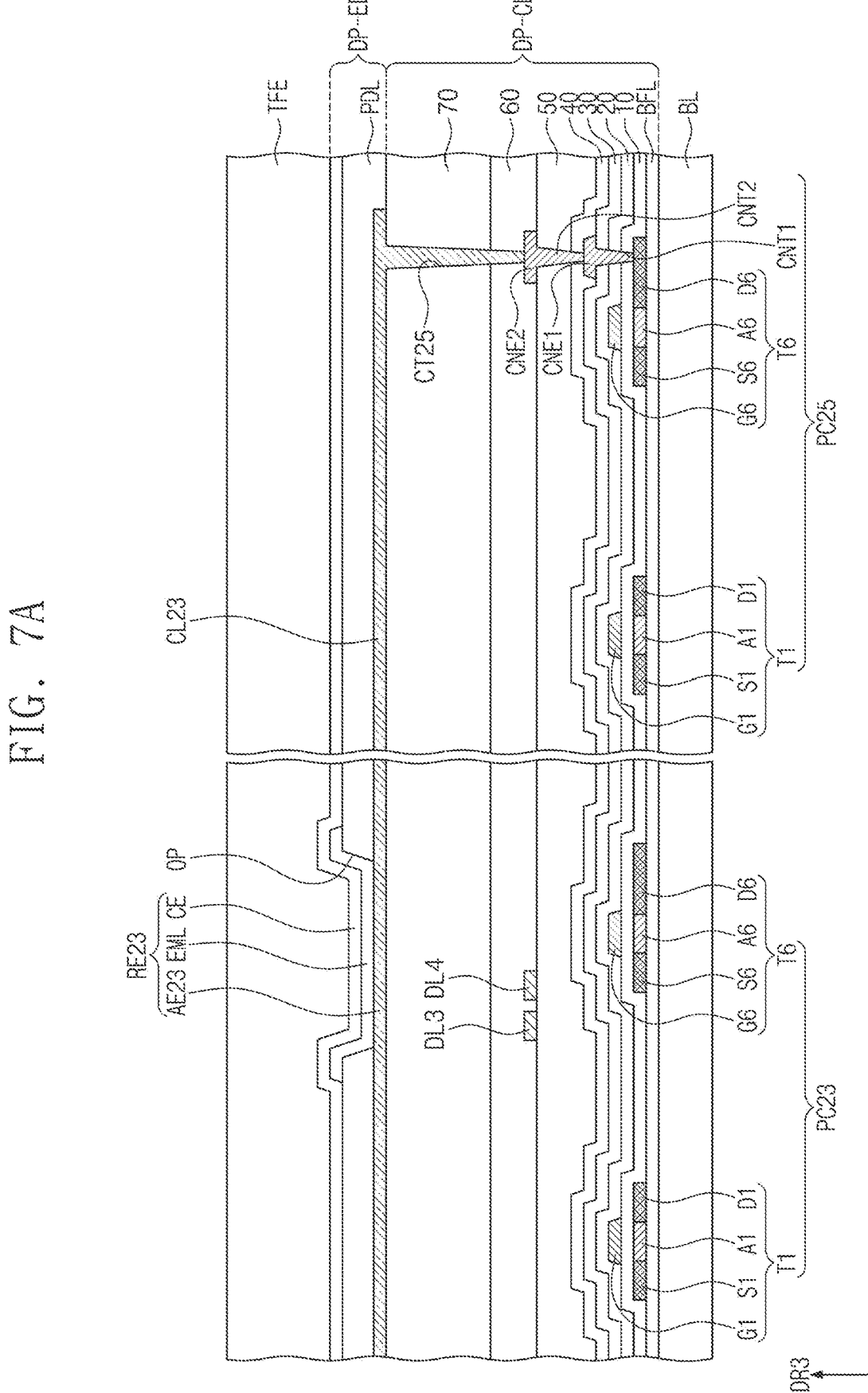

FIG. 7A is a cross-sectional view illustrating a portion of the first light-emitting element RE23, the pixel circuit PC23, and the pixel circuit PC25 of the display panel DP according to one or more embodiments of the present disclosure.

The first light-emitting element RE23 illustrated in FIG. 7A may be similar to the first light-emitting element RE11 illustrated in FIG. 6, and a configuration of the first transistor T1 and the sixth transistor T6 of the pixel circuit PC23 illustrated in FIG. 7A may be similar to that of the first transistor T1 and the sixth transistor T6 of the pixel circuit PC11 illustrated in FIG. 6. Thus, additional, repetitive description will be omitted to avoid redundancy.

Also, a configuration of the first transistor T1 and the sixth transistor T6 of the pixel circuit PC25 illustrated in FIG. 7A may be similar to that of the first transistor T1 and the sixth transistor T6 of the pixel circuit PC11 illustrated in FIG. 6. Thus, additional description will be omitted to avoid redundancy.

Referring to FIGS. 5 and 7A, an anode AE23 of the first light-emitting element RE23 may overlap a portion of the pixel circuit PC23. The connection electrode CL23 has a shape of extending from the anode AE23 in the first direction DR1. That is, a portion of the anode AE23 may be the connection electrode CL23. The connection electrode CL23 is connected with the second connection electrode CNE2 through the connection node CT25 penetrating the sixth insulating layer 60 and the seventh insulating layer 70. Accordingly, the anode AE23 of the first light-emitting element RE23 may be electrically connected with the second electrode D6 of the sixth transistor T6 in the pixel circuit PC25 through the connection electrode CL23, the connection node CT25, the second connection electrode CNE2, and the first connection electrode CNE1.

In one or more embodiments, the data lines DL3 and DL4 may be located on the fifth insulating layer 50. The data lines DL3 and DL4 may overlap (e.g., in plan view) the anode AE23 of the first light-emitting element RE23.

Figure 7B:
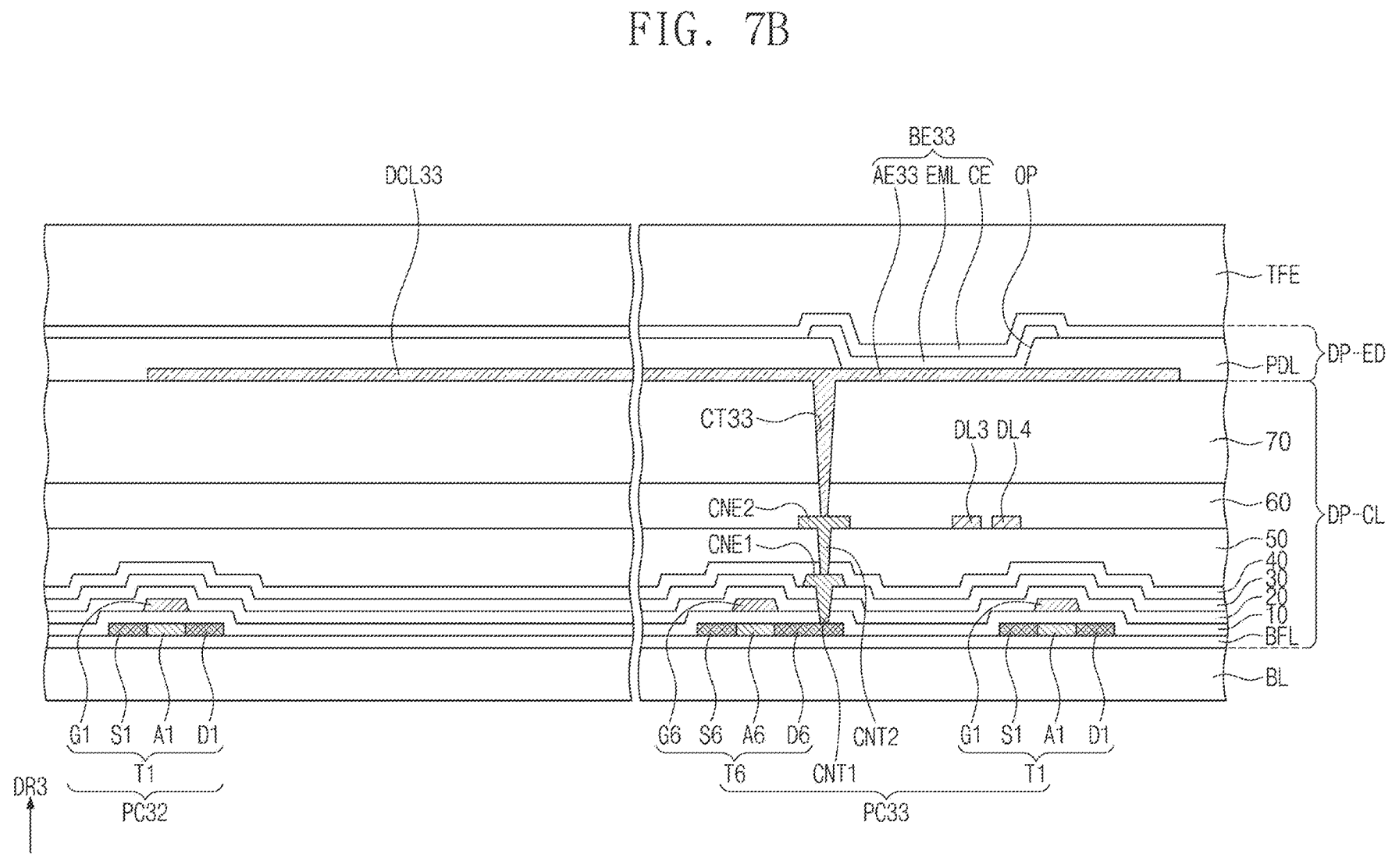

FIG. 7B is a cross-sectional view illustrating a portion of the second light-emitting element BE33, the pixel circuit PC33, and the pixel circuit PC32 of the display panel DP according to one or more embodiments of the present disclosure.

The second light-emitting element BE33 illustrated in FIG. 7B may be similar to the first light-emitting element RE11 illustrated in FIG. 6, and a configuration of the first transistor T1 and the sixth transistor T6 of the pixel circuit PC33 illustrated in FIG. 7B may be similar to that of the first transistor T1 and the sixth transistor T6 of the pixel circuit PC11 illustrated in FIG. 6. Thus, additional, repetitive description will be omitted to avoid redundancy.

Also, a configuration of the first transistor T1 of the pixel circuit PC32 illustrated in FIG. 7B may be similar to that of the first transistor T1 of the pixel circuit PC11 illustrated in FIG. 6. Thus, additional description will be omitted to avoid redundancy.

Referring to FIGS. 5 and 7B, an anode AE33 of the second light-emitting element BE33 may overlap a portion of the pixel circuit PC33 (e.g., in plan view). Also, the anode AE33 may extend in the first direction DR1. A portion of the anode AE33 may be the dummy connection electrode DCL33. The dummy connection electrode DCL33 may overlap a portion of the pixel circuit PC32. That is, the second light-emitting element BE33 may include the dummy connection electrode DCL33 extending from the anode AE33, as well as the anode AE33.

The anode AE33 of the second light-emitting element BE33 is connected with the second connection electrode CNE2 through the connection node CT33 penetrating the seventh insulating layer 70 and the sixth insulating layer 60. Accordingly, the anode AE33 of the second light-emitting element BE33 may be electrically connected with the second electrode D6 of the sixth transistor T6 in the pixel circuit PC33 through the connection node CT33, the second connection electrode CNE2, and the first connection electrode CNE1.

In one or more embodiments, the data lines DL3 and DL4 may be located on the fifth insulating layer 50. The data lines DL3 and DL4 may overlap the anode AE33 of the second light-emitting element BE33.

Figure 8A:
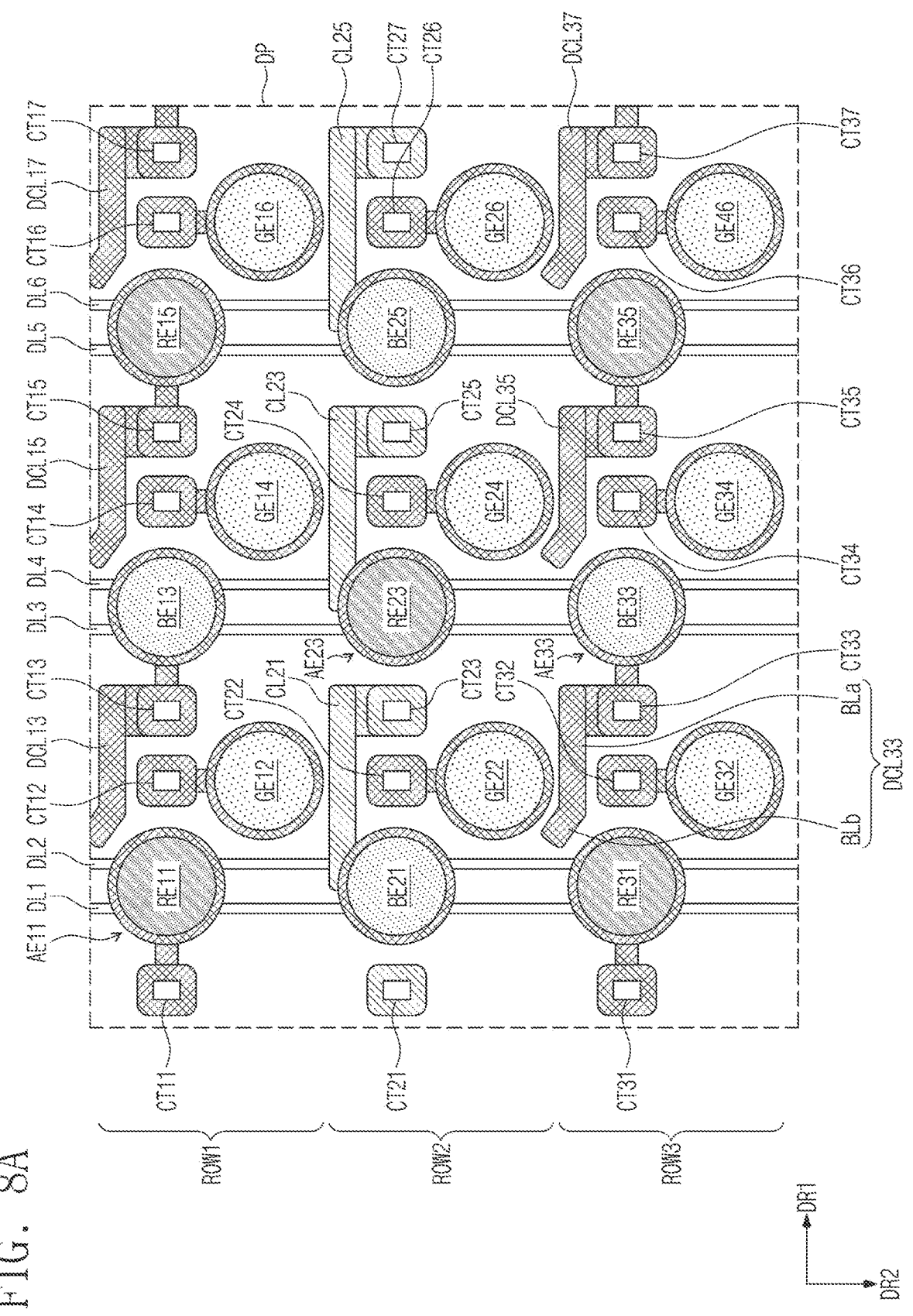
FIGS. 8A to 8C are plan views of a display panel according to one or more embodiments of the present disclosure.
Figure 8B:
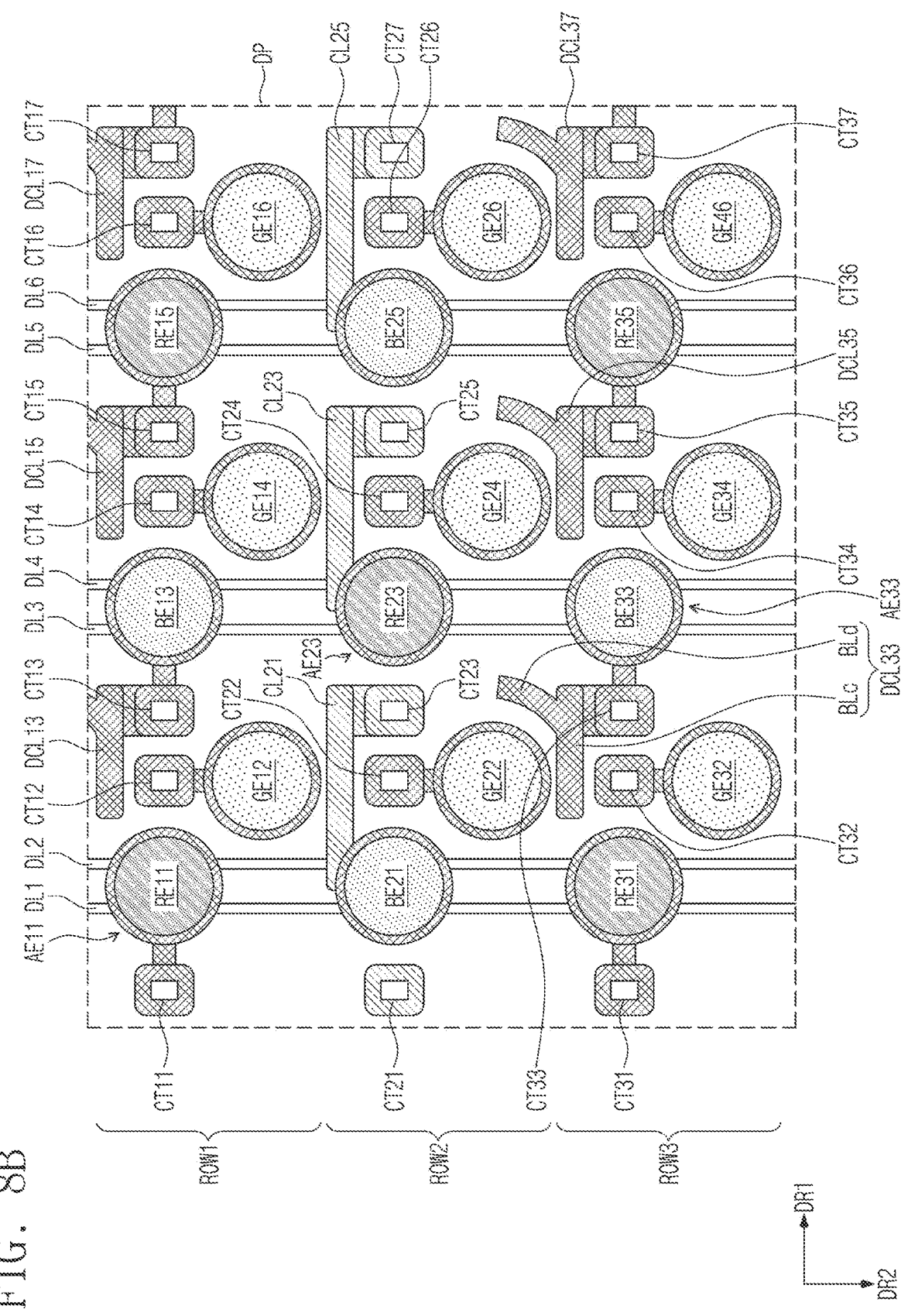
Figure 8C:
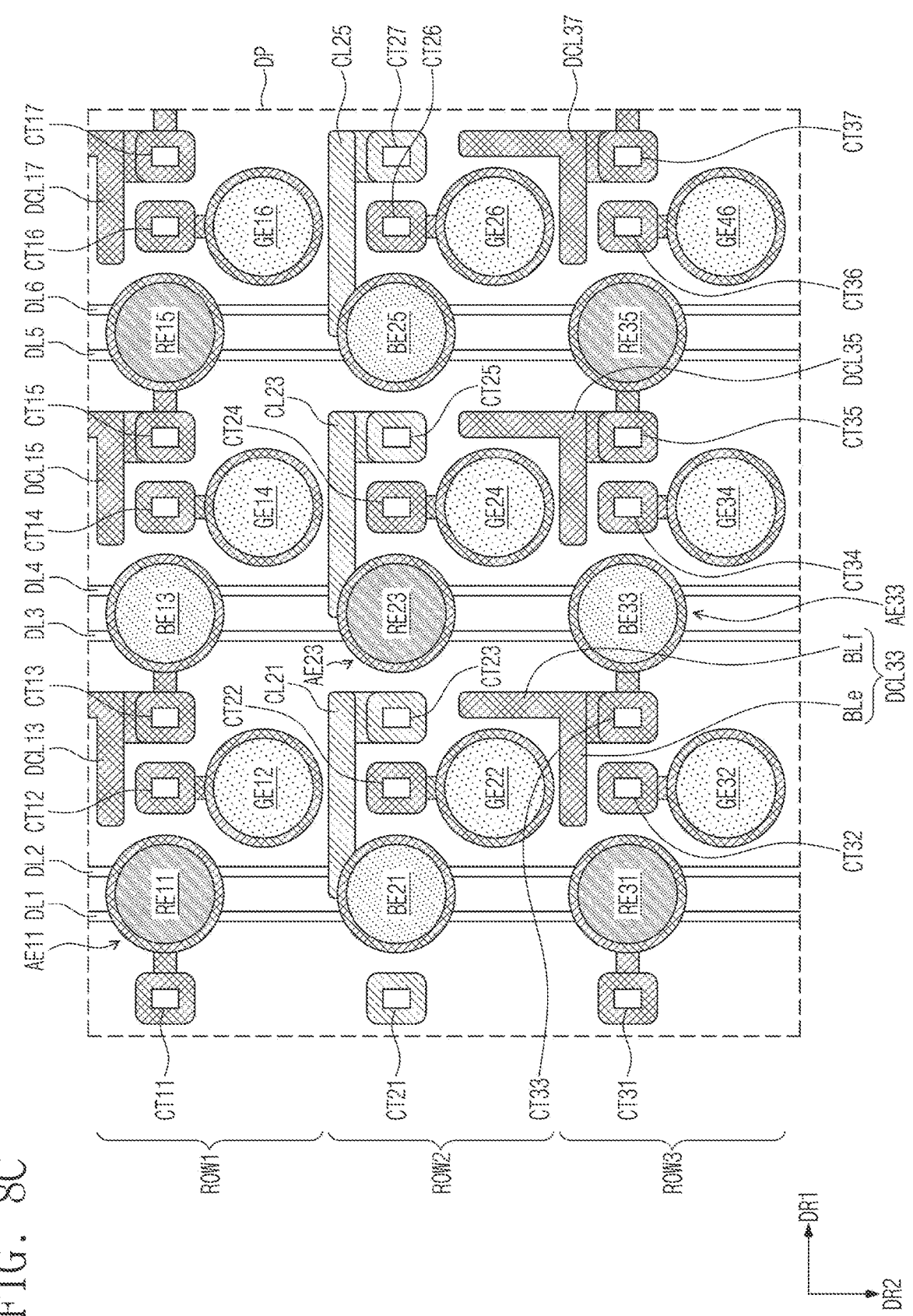

FIGS. 8A to 8C are plan views of the display panel DP according to one or more embodiments of the present disclosure.

Because the display panel DP illustrated in FIGS. 8A to 8C is similar to the display panel DP illustrated in FIG. 5, the same reference numerals/signs are used, and thus, additional description will be omitted to avoid redundancy.

Referring to FIG. 8A, the dummy connection electrode DCL33 includes a first branch part BLa and a second branch part BLb.

The first branch part BLa has a shape of extending from one side of the connection node CT33 connected with the anode AE33 of the second light-emitting element BE33 in a direction in which the first light-emitting element RE31 is located. In one or more embodiments, the first branch part BLa may be parallel to the connection electrode CL21.

The second branch part BLb extends from the first branch part BLa. In one or more embodiments, the second branch part BLb may extend from the first branch part BLa with an angle (e.g., a predetermined angle). In one or more embodiments, an angle between the first branch part BLa and the second branch part BLb may be 90 degrees or more. In one or more embodiments, a portion of the first branch part BLa and the second branch part BLb may have a shape of surrounding a portion of, or extending along, a left side of the third light-emitting element GE22.

The dummy connection electrodes DCL13, DCL15, and DCL17 located at the first row ROW1 and the dummy connection electrodes DCL35 and DCL37 located at the third row ROW3 may be identical in shape to the dummy connection electrode DCL33.

Referring to FIG. 8B, the dummy connection electrode DCL33 includes a third branch part BLc and a fourth branch part BLd.

The third branch part BLc has a shape of extending from one side of the connection node CT33 connected with the anode AE33 of the second light-emitting element BE33 in a direction in which the first light-emitting element RE31 is located. The fourth branch part BLd extends from the third branch part BLc.

In one or more embodiments, an angle between the third branch part BLc and the fourth branch part BLd may be 90 degrees or more. In one or more embodiments, a portion of the third branch part BLc and the fourth branch part BLd may have a shape of surrounding a portion of a right side of the third light-emitting element GE22.

The dummy connection electrodes DCL13, DCL15, and DCL17 located at the first row ROW1 and the dummy connection electrodes DCL35 and DCL37 located at the third row ROW3 may be identical in shape to the dummy connection electrode DCL33.

Referring to FIG. 8C, the dummy connection electrode DCL33 includes a fifth branch part BLe and a sixth branch part BLf.

The fifth branch part BLe has a shape of extending from one side of the connection node CT33 connected with the anode AE33 of the second light-emitting element BE33 in a direction in which the first light-emitting element RE31 is located. The sixth branch part BLf extends from the one side of the connection node CT33. An angle that the fifth branch part BLe and the sixth branch part BLf form may be a right angle (e.g., 90 degrees).

The fifth branch part BLe and the sixth branch part BLf may be located on the right side of the third light-emitting element GE22.

The dummy connection electrodes DCL13, DCL15, and DCL17 located at the first row ROW1 and the dummy connection electrodes DCL35 and DCL37 located at the third row ROW3 may be identical in shape to the dummy connection electrode DCL33.

A length, a width, or a shape of each of the dummy connection electrodes DCL13, DCL15, DCL17, DCL33, DCL35, and DCL37 illustrated in FIGS. 8A to 8C may be designed in consideration of a capacitance formed by the connection electrodes CL21, CL23, and CL25.

A display device having the above configuration may include at least four light-emitting elements that provide different respective lights.

A data-driving circuit only outputs different color data signals to first to fourth data lines. That is, because each of the first to fourth data lines outputs only a data signal corresponding to one color, power consumption of the display device may be reduced.

Also, a display quality may be improved by reducing or minimizing a coupling capacitance difference between pixels.

While the present disclosure has been described with reference to embodiments thereof, it will be apparent to those of ordinary skill in the art that various changes and modifications may be made thereto without departing from the spirit and scope of the present disclosure as set forth in the following claims, with functional equivalents thereof to be included therein.

What is claimed is:

1. A display panel comprising:
a plurality of pixel circuits at a first row and a second row; and
a plurality of light-emitting elements at the first row and the second row,
wherein each of the light-emitting elements at the first row comprises an anode, and is electrically connected with, and overlap, corresponding one of the pixel circuits at the first row,
wherein the anode of each of the light-emitting elements at the first row comprises a dummy connection electrode extending from the anode, and
wherein a first light-emitting element among the light-emitting elements at the second row is spaced from a first pixel circuit among the pixel circuits at the second row, and is electrically connected with the first pixel circuit through a connection electrode and a first connection node.

2. The display panel of claim 1, wherein a second light-emitting element among the light-emitting elements at the second row is electrically connected with a second pixel circuit among the pixel circuits at the second row through a second connection node.

3. The display panel of claim 1, wherein the first light-emitting element is spaced from the first pixel circuit in a first direction.

4. The display panel of claim 3, wherein the first light-emitting element comprises an anode, and
wherein the connection electrode extends from the anode of the first light-emitting element in the first direction.

5. The display panel of claim 4, wherein the dummy connection electrode extends from the anode of each of the light-emitting elements at the first row in a direction that is opposite to the first direction.

6. The display panel of claim 4, wherein the dummy connection electrode comprises a first branch part and a second branch part, wherein the first branch part extends from the anode of each of the light-emitting elements at the first row in a direction that is opposite to the first direction, and wherein the second branch part extends from, and forms an angle with, the first branch part.

7. The display panel of claim 1, wherein each of the plurality of pixel circuits is connected with a corresponding data line among first to fourth data lines.

8. The display panel of claim 7, wherein the light-emitting elements comprises a first light-emitting element for emitting light corresponding to a first color, a second light-emitting element for emitting light corresponding to a second color, and a third light-emitting element for emitting light corresponding to a third color.

9. The display panel of claim 8, wherein the first data line is configured to transfer a data signal corresponding to the first color, wherein the third data line is configured to transfer a data signal corresponding to the second color, wherein the second data line is configured to transfer a data signal corresponding to the third color, and wherein the fourth data line is configured to transfer a data signal corresponding to the third color.

10. The display panel of claim 9, wherein the first pixel circuit is connected with the first data line, and wherein the second light-emitting element at the second row is electrically connected with a second pixel circuit connected with the third data line from among the pixel circuits at the second row.

11. A display panel comprising:

first to fourth data lines;

a plurality of pixel circuits respectively at crossing regions of first to fourth columns and first and second rows, and respectively connected with a corresponding data line among the first to fourth data lines; and a plurality of light-emitting elements, wherein the light-emitting elements at the first row are respectively electrically connected with the pixel circuits at the first row, wherein a first light-emitting element at a crossing region of the second row and the first column among the plurality of light-emitting elements is electrically connected with a corresponding pixel circuit of the pixel circuits at a crossing region of the second row and the third column through an anode, a connection electrode extending from the anode in a first direction, and a connection node, and wherein a second light-emitting element at a crossing region of the first row and the first column among the plurality of light-emitting elements comprises an anode, and a dummy connection electrode parallel to the connection electrode and extending from the anode.

12. The display panel of claim 11, wherein a third light-emitting element at a crossing region of the second row and the second column among the plurality of light-emitting elements is electrically connected with a corresponding pixel circuit among the pixel circuits at the second row, and wherein a fourth light-emitting element at a crossing region of the second row and the fourth column among the plurality of light-emitting elements is electrically connected with another corresponding pixel circuit among the pixel circuits at the second row.

13. The display panel of claim 11, wherein the light-emitting elements respectively at crossing regions of the first row and the first to fourth columns are respectively electrically connected with the pixel circuits respectively at the crossing regions of the first row and the first to fourth columns.

14. The display panel of claim 11, wherein the dummy connection electrode comprises:

a first branch part extending from the anode of the second light-emitting element; and a second branch part extending from the first branch part at an angle.

15. The display panel of claim 14, wherein the first branch part is parallel to the connection electrode.

16. A display device comprising:

a display comprising a plurality of insulating layers, a plurality of light-emitting elements and first to fourth pixel circuits connected with first to fourth data lines, respectively, wherein each of the plurality of light-emitting elements comprises an anode and a cathode, wherein the plurality of insulating layers comprise a first insulating layer on the first to fourth pixel circuits, and a second insulating layer on the first insulating layer, wherein the first to fourth data lines are between the first insulating layer and the second insulating layer, wherein the anode of each of the plurality of light-emitting elements is on the second insulating layer, wherein an anode of a first light-emitting element at a first row among the plurality of light-emitting elements comprises a dummy connection electrode extending from the anode of the first light-emitting element, wherein an anode of a second light-emitting element at a second row among the plurality of light-emitting elements comprises a connection electrode extending from the anode of the second light-emitting element, wherein the anode of the first light-emitting element at the first row is connected with the first pixel circuit through a first connection node penetrating the second insulating layer and through a first contact hole penetrating the first insulating layer, and wherein the connection electrode of the second light-emitting element at the second row is connected with the third pixel circuit through a second connection node penetrating the second insulating layer, and through a second contact hole penetrating the first insulating layer.

17. The display device of claim 16, wherein the connection electrode of the second light-emitting element at the second row extends from the anode of the second light-emitting element in a first direction, and wherein the dummy connection electrode of the first light-emitting element at the first row is parallel to the connection electrode at the second row.

18. The display device of claim 16, wherein the dummy connection electrode comprises a first branch part and a second branch part, wherein the first branch part is parallel to the connection electrode at the second row, wherein the second branch part extends from the first branch part at an angle.

19. The display device of claim 16, wherein the dummy connection electrode of the first light-emitting element at the first row overlaps the second pixel circuit at the first row, and wherein a connection electrode of the first light-emitting element at the second row overlaps the third pixel circuit at the second row.

20. The display device of claim 16, wherein the first and second data lines overlap the anode of the first light-emitting element at the first row, and wherein the third and fourth data lines overlap the anode of the second light-emitting element at the second row.

\* \* \* \* \*